(12) United States Patent
Saranathan et al.

(10) Patent No.: US 8,120,360 B2
(45) Date of Patent: Feb. 21, 2012

(54) SYSTEM AND METHOD OF ANGULAR ELLIPTIC CENTRIC VIEW ORDERING FOR 3D MR ACQUISITIONS

(75) Inventors: Manojkumar Saranathan, Rochester, MN (US); Ersin Bayram, Delafield, WI (US); Dan W. Rettmann, Rochester, MN (US); Reed F. Busse, Madison, WI (US)

(73) Assignee: General Electric Company, Schenectady, NY (US)

( * ) Notice: Subject to any disclaimer, the term of this patent is extended or adjusted under 35 U.S.C. 154(b) by 318 days.

(21) Appl. No.: 12/568,355

(22) Filed: Sep. 28, 2009

(65) Prior Publication Data

US 2010/0052681 A1 Mar. 4, 2010

Related U.S. Application Data

(63) Continuation-in-part of application No. 12/014,267, filed on Jan. 15, 2008, now Pat. No. 7,595,639.

(51) Int. Cl.
*G01V 3/00* (2006.01)

(52) U.S. Cl. ...................................... 324/309; 324/307
(58) Field of Classification Search .......... 324/300–322; 600/407–445
See application file for complete search history.

(56) References Cited

U.S. PATENT DOCUMENTS

| 6,518,759 B2 * | 2/2003 | Bernstein ...................... 324/307 |
| 7,245,786 B2 * | 7/2007 | Mitchell et al. ............... 382/280 |
| 7,265,547 B2 * | 9/2007 | Vu ................................ 324/309 |
| 7,595,639 B2 * | 9/2009 | Bayram et al. ................ 324/307 |
| 7,649,354 B2 * | 1/2010 | Bayram et al. ................ 324/309 |
| 8,022,700 B2 * | 9/2011 | Nimbargi et al. ............. 324/309 |
| 2010/0085048 A1 * | 4/2010 | Bouchard et al. ............. 324/307 |
| 2010/0145185 A1 * | 6/2010 | Hong et al. ................... 600/420 |

* cited by examiner

*Primary Examiner* — Brij Shrivastav (57) ABSTRACT

A method of magnetic resonance (MR) imaging includes segmenting a $k_y$-$k_z$ plane comprising a plurality of encoding points into a plurality of annular segments. For each annular segment, a view ordering is defined based on a polar angle associated with each encoding point contained within the annular segment. MR data is acquired for the plurality of encoding points based on the view ordering for each annular segment and at least one MR image is generated using the acquired MR data.

17 Claims, 7 Drawing Sheets

SYSTEM AND METHOD OF ANGULAR ELLIPTIC CENTRIC VIEW ORDERING FOR 3D MR ACQUISITIONS

CROSS-REFERENCE TO RELATED APPLICATION

The present application is a continuation-in-part of and claims priority of U.S. patent application Ser. No. 12/014,267 filed Jan. 15, 2008.

BACKGROUND OF THE INVENTION

The invention relates generally to magnetic resonance imaging (MRI) and, more particularly, to a system and method of optimizing 3D magnetic resonance (MR) acquisitions by using an angular elliptic centric view ordering scheme.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, or "longitudinal magnetization", $M_z$, may be rotated, or "tipped", into the x-y plane to produce a net transverse magnetic moment $M_t$. A signal is emitted by the excited spins after the excitation signal $B_1$ is terminated and this signal may be received and processed to form an image.

When utilizing these signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

As is generally well known, a number of MR imaging techniques have been developed to improve contrast between target anatomical features and background features. By improving the contrast between the target anatomical features and the background tissue, blood, etc., the diagnostic and probative value of the resulting image is also improved, which facilitates more accurate, timely, and efficient diagnosis by health care providers.

Because the central part of k-space data contributes to the bulk of the acquired signal and contrast in MR imaging, it is desirable in many clinical applications (such as magnetization preparation sequences and contrast-enhanced studies) to acquire the central part of k-space as quickly as possible. Such acquisition includes optimal timing after contrast delivery and/or magnetization preparation.

One known centric view ordering technique acquires the data in cartesian spiral fashion, starting from the center of k-space and traversing outward in k-space. However, because the view ordering is purely index-based, this centric view order is typically only well-suited for applications in which the field of view in phase encode directions are similar (i.e., $\Delta k_x \approx \Delta k_y$).

Elliptic centric view ordering is another known technique wherein k-space data is acquired by starting at k-space center and expanding to the outer edges by acquiring the next closest point based on spectral distance. Such a view ordering is especially critical in contrast enhanced studies where the central part of k-space data is desired to be captured very quickly after arterial enhancement, but before venous enhancement, thus providing a high venous suppression with good arterial contrast. Although such behavior is desirable to capture the bulk of the contrast around low frequency k-space regions, in the outer edges of k-space (i.e., the high-frequency region), elliptic centric view ordering results in large jumps because the acquisition sequence is based simply on spectral distance. As such, as an acquisition proceeds to the higher frequency regions of k-space, such jumps cause large amplitude gradient waveforms with opposite polarities to be played out in alternating fashion, giving rise to eddy current induced artifacts.

Other known acquisition orders rely on random acquisition in the central region of k-space and radial, spiral, or sequential ordering in the outer regions of k-space. Although such approaches may reduce artifacts, such approaches are complex and require at least two different view orders. Furthermore, such approaches introduce uncertainty due to stochastic acquisition in the most important (i.e., the central) region of k-space.

It would therefore be desirable to have a system and method of MR imaging implementing a simple view-ordering scheme that minimizes the total traveled distance in k-space, while preserving the spectral elliptic centric ordering scheme.

BRIEF DESCRIPTION OF THE INVENTION

In accordance with an embodiment, a method of magnetic resonance (MR) imaging includes segmenting a $k_y$-$k_z$ plane comprising a plurality of encoding points into a plurality of annular segments; for each annular segment, defining a view ordering based on a polar angle associated with each encoding point contained within the annular segment; acquiring MR data for the plurality of encoding points based on the view ordering for each annular segment; and generating at least one MR image using the acquired MR data.

In accordance with another embodiment, a computer readable storage medium having a computer program stored thereon and representing a set of instructions that, when executed by a computer, causes the computer to segment a $k_y$-$k_z$ plane comprising a plurality of encoding points into a plurality of annular segments, for each annular segment, define a view ordering based on a polar angle associated with each encoding point contained within the annular segment, acquire MR data for the plurality of encoding points based on the view ordering for each annular segment and generate at least one MR image using the acquired MR data.

In accordance with another embodiment, a method of magnetic resonance (MR) imaging includes calculating a cost for each encoding point in a plurality of encoding points to be acquired in k-space based on a polar angle and a radial distance from a center of k-space, the radial distance scaled based on a resolution of an acquisition, acquiring MR data for each encoding point based on the cost, and reconstructing an MR image using the acquired MR data.

Various other features and advantages will be made apparent from the following detailed description and the drawings.

BRIEF DESCRIPTION OF THE DRAWINGS

The drawings illustrate embodiments presently contemplated for carrying out the invention.

In the drawings.

DETAILED DESCRIPTION OF THE PREFERRED EMBODIMENT

Embodiments of the invention include a system and method of optimizing 3D MR acquisitions by using an angular elliptic centric view ordering scheme. Embodiments of the invention are directed to the acquisition of MR data that is less sensitive to eddy current induced artifacts. In this regard, the invention provides greater uniform centric weighting that is particularly well suited, but not limited to, contrast enhanced studies. The view ordering technique is less susceptible to steady state imaging artifacts than an elliptic centric approach while still providing optimized contrast. Furthermore, the view ordering technique improves image quality of applications that relay on elliptic centric view ordering and contrast-enhanced dynamic applications such as time-Resolved Imaging of Contrast Kinetics (TRICKS) and MR angiography. The technique is a generic view ordering scheme that can be applied to an non-segmented steady state imaging, as well as segmented steady state imaging and transient state imaging by interleaved view ordering of angular elliptic sorted data.

Figure 1:
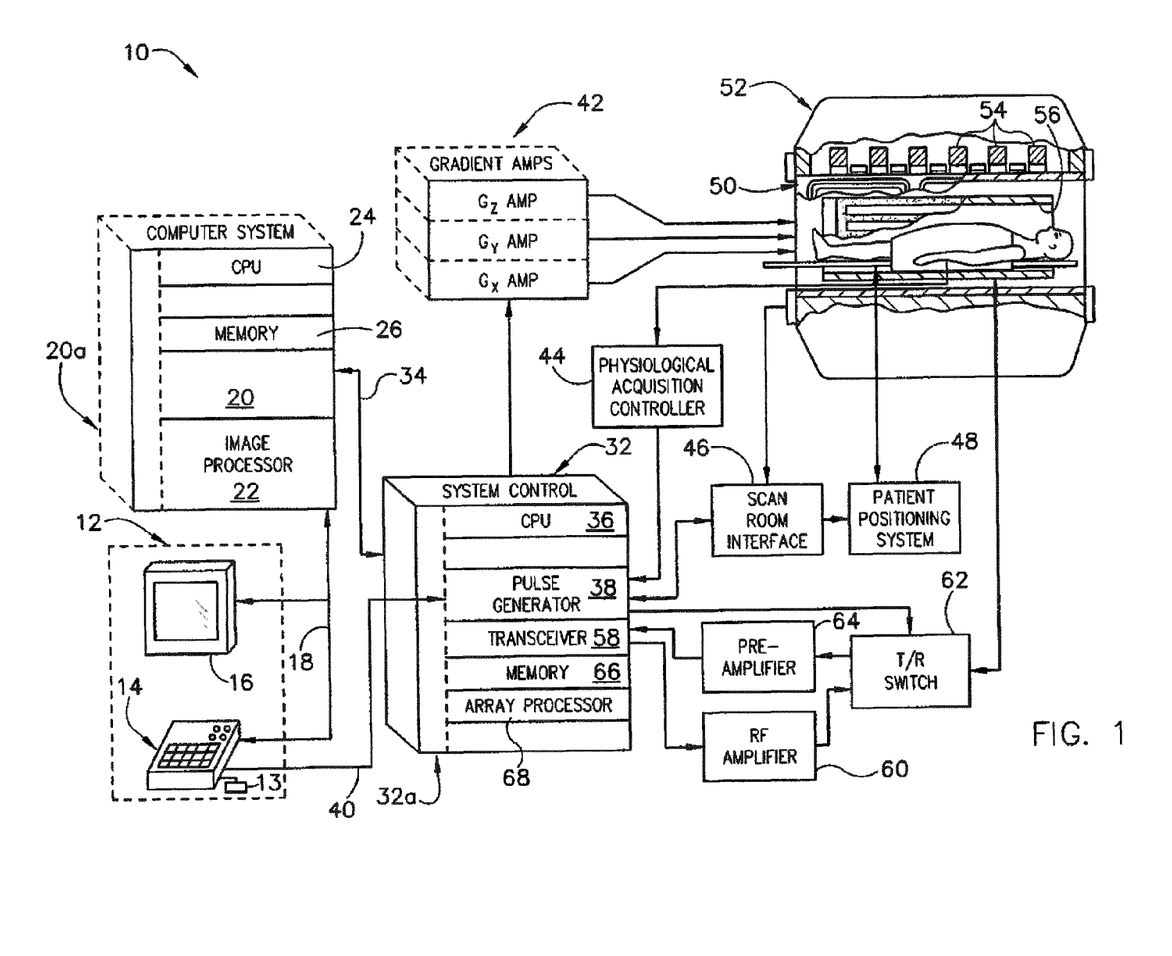
FIG. 1 is a schematic block diagram of an exemplary MR imaging system incorporating an embodiment of the invention.

Referring to FIG. 1, the major components of an exemplary magnetic resonance imaging (MRI) system 10 incorporating embodiments of the invention are shown. The operation of the system is controlled from an operator console 12 which includes a keyboard or other input device 13, a control panel 14, and a display screen 16. The console 12 communicates through a link 18 with a separate computer system 20 that enables an operator to control the production and display of images on the display screen 16. The computer system 20 includes a number of modules which communicate with each other through a backplane 20a. These include an image processor module 22, a CPU module 24 and a memory module 26 that may include a frame buffer for storing image data arrays. The computer system 20 is linked to archival media devices, permanent or back up memory or a network for storage of image data and programs, and communicates with a separate system control 32 through a high speed serial link 34. The input device 13 can include a mouser joystick, keyboard, track ball, touch activated screen, light wand, voice control, or any similar or equivalent input device, and may be used for interactive geometry prescription.

The system control 32 includes a set of modules connected together by a backplane 32a. These include a CPU module 36 and a pulse generator module 38 which connects to the operator console 12 through a serial link 40. It is through link 40 that the system control 32 receives commands from the operator to indicate the scan sequence that is to be performed. The pulse generator module 38 operates the system components to carry out the desired scan sequence and produces data which indicates the timing, strength and shape of the RF pulses produced, and the timing and length of the data acquisition window. The pulse generator module 38 connects to a set of gradient amplifiers 42, to indicate the timing and shape of the gradient pulses that are produced during the scan. The pulse generator module 38 can also receive patient data from a physiological acquisition controller 44 that receives signals from a number of different sensors connected to the patient, such as ECG signals from electrodes attached to the patient. And finally, the pulse generator module 38 connects to a scan room interface circuit 46 which receives signals from various sensors associated with the condition of the patient and the magnet system. It is also through the scan room interface circuit 46 that a patient positioning system 48 receives commands to move the patient to the desired position for the scan.

The gradient waveforms produced by the pulse generator module 38 are applied to the gradient amplifier system 42 having Gx, Gy, and Gz amplifiers. Each gradient amplifier excites a corresponding physical gradient coil in a gradient coil assembly generally designated 50 to produce the magnetic field gradients used for spatially encoding acquired signals. The gradient coil assembly 50 forms part of a magnet assembly 52 which includes a polarizing magnet 54 and a whole-body RF coil 56. A transceiver module 58 in the system control 32 produces pulses which are amplified by an RF amplifier 60 and coupled to the RF coil 56 by a transmit/receive switch 62. The resulting signals emitted by the excited nuclei in the patient may be sensed by the same RF coil 56 and coupled through the transmit/receive switch 62 to a preamplifier 64. The amplified MR signals are demodulated, filtered, and digitized in the receiver section of the transceiver 58. The transmit/receive switch 62 is controlled by a signal from the pulse generator module 38 to electrically connect the RF amplifier 60 to the coil 56 during the transmit mode and to connect the preamplifier 64 to the coil 56 during the receive mode. The transmit/receive switch 62 can also enable a separate RF coil (for example, a surface coil) to be used in either the transmit or receive mode.

The MR signals picked up by the RF coil 56 are digitized by the transceiver module 58 and transferred to a memory module 66 in the system control 32. A scan is complete when an array of raw k-space data has been acquired in the memory module 66. This raw k-space data is rearranged into separate k-space data arrays for each image to be reconstructed, and each of these is input to an array processor 68 which operates to Fourier transform the data into an array of image data. This image data is conveyed through the serial link 34 to the computer system 20 where it is stored in memory. In response to commands received from the operator console 12, this image data may be archived in long term storage or it may be further processed by the image processor 22 and conveyed to the operator console 12 and presented on the display 16.

The MR system described in FIG. 1 may also be equipped with a receive coil array that picks up the MR signals. Such coil arrays are well-known in the art and include whole body arrays as well as partial body arrays, such as head coil arrays, cardiac coil arrays, and spine coil arrays. Embodiments of the invention include a parallel imaging method wherein a region or volume of interest is sampled with an array of RF receive coils. In this regard, the invention is not limited to a particular coil array type or orientation.

Embodiments of the invention are described with respect to the acquisition of MR data using a center-out angular elliptic phase encoding order that reduces the effect of eddy currents by reducing the step-size or "jump" between successive phase encoding steps based on spectral distance. It is contemplated, however, that other encoding orders may be implemented for the angular elliptic phase encoding including, but not limited to, reverse angular elliptic ordering where the k-space points farthest from k-space center are acquired first. Furthermore, a hybrid approach is also possible where a delay is applied to the angular elliptic centric acquisition during which a different region of k-space, such as the outer edges, can be sampled before switching to a centric acquisition. Such a hybrid approach may be applicable, as an example, when a contrast bolus injection has not yet arrived at the imaging region. In such an instance, the high-frequency/high resolution regions of k-space may be sampled and, upon arrival of the agent, the acquisition may be switched to acquire the central k-space data according to embodiments of the invention. Embodiments of the invention may be carried out with the MR imaging apparatus illustrated in FIG. 1, or equivalents thereof and may be particularly applicable to the acquisition of MR data with 3D Cartesian sampling where two directional phase encodings are performed.

Figure 2:
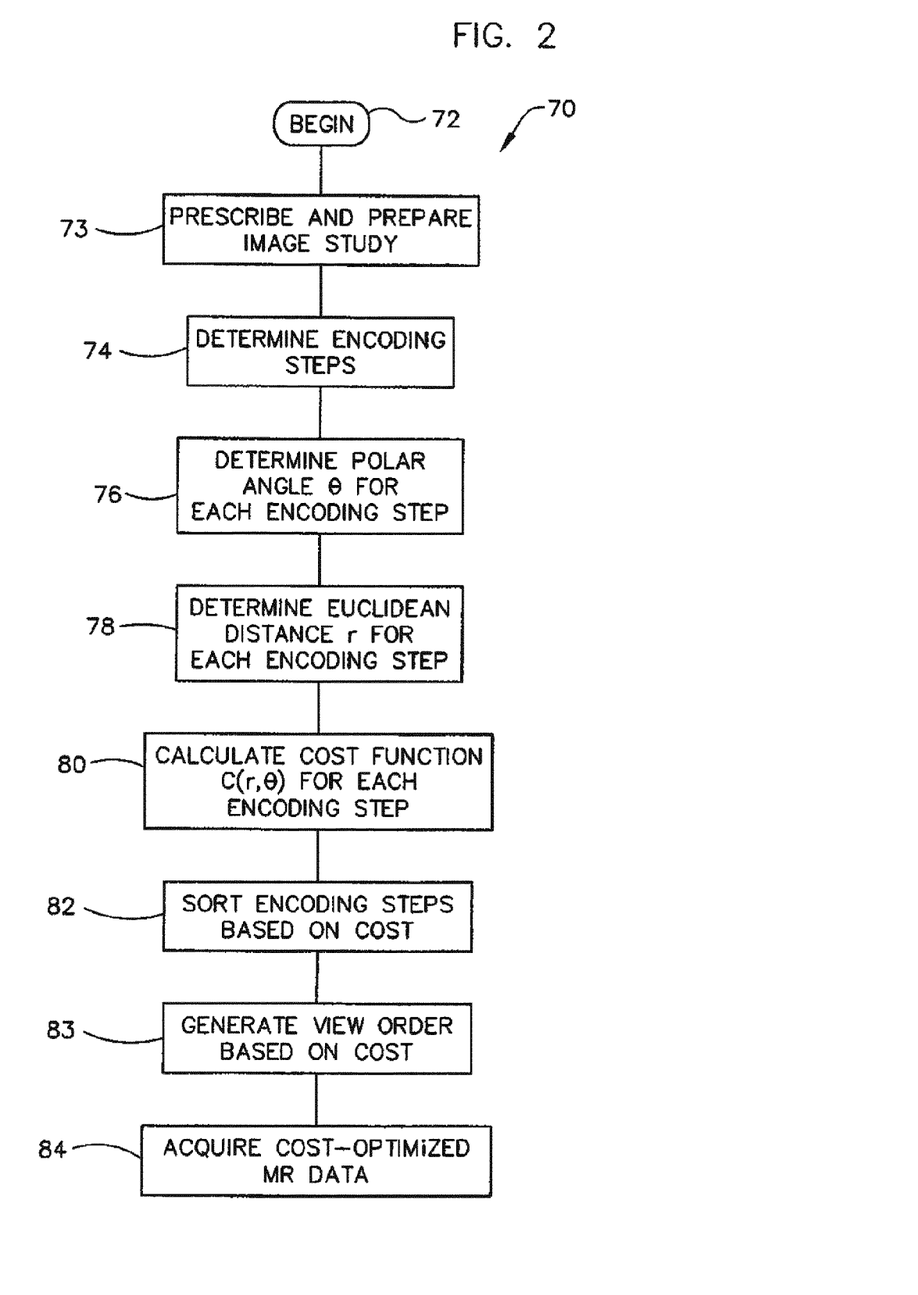
FIG. 2 is a flowchart setting forth a technique of encoding k-space locations based on cost, in accordance with an embodiment of the invention.

Referring now to FIG. 2, a technique or method 70 for acquiring MR data with an angular elliptic centric view ordering scheme that provides an optimized multi-variable cost function having minimized total traveled distance in k-space, with reduced sensitivity to eddy current effects is set forth. The MR data is acquired without large phase encoding jumps between repetition times (TRs). The method 70 begins at STEP 72 and at STEP 73 an MR imaging study is prescribed and prepared. Prescription and preparation of an MR imaging study STEP 73 includes user-identification of various scan parameters to define the impending scan session. Based on these parameters, the method continues at STEP 74 to determine the number of encoding steps for each k-space of the acquisition. As is well-known, conventional 3D Cartesian acquisition are performed with two directional phase encodings that can be defined by a phase encoding axis ($k_y$) and a partition (or slice) encoding axis ($k_z$) on a rectangular $k_y$-$k_z$ grid. As such, each encoding step is defined by a unique $k_y$, $k_z$ location or position in k-space. The method 70 calculates or otherwise determines at STEP 76 the polar angle, $\theta$, in radians (0-$2\pi$) or in degrees (0-360°) for each encoding steps ($k_z$, $k_y$) of k-space relative to the $k_z$ axis, where $\theta$=arctan ($k_y/k_z$) or arctan ($k_z/k_y$). The method 70 then determines at STEP 78 the Euclidian distance r of each encoding step from the center of k-space. The distance r from the center of k-space for each encoding step ($k_y$, $k_z$) is calculated from $(k_y^2+k_z^2)^{1/2}$, which is directional radial distance from the k-space origin.

At STEP 80 a cost is calculated for each encoding step using a cost function C(r, $\theta$). The encoding steps or points, defined by variables r and $\theta$, are then sorted in monotonically increasing order, based on the associated cost for each point, at STEP 82. At STEP 83 a view order is generated based on cost. K-space is traversed beginning, in one embodiment, with points having the lowest cost which corresponds to the closest to the center (origin) of k-space (i.e., lowest phase encoding gradient value) to the points with the higher cost which are farther from the center of k-space. Accordingly, because the cost function is weighted both as a function of the spectral distance r and the angular location $\theta$, the cost function weights the spectral distance closer to the k-space center higher and balances spectral distance with angular location to achieve at least two goals: 1) collect low frequency data having optimized contrast; and 2) reduce the gradient polarity switches away from the k-space center by sorting with more bias on the angular location. Thus, the spectral distance between each phase encoding step is optimized relative to conventional elliptic acquisitions and, as a result, the effect of eddy currents is reduced and an image substantially devoid of eddy current induced artifacts can be reconstructed.

In other embodiments, other encoding orders may be implemented as well. Such embodiments may include but are not limited to the reverse angular elliptic ordering where the k-space points farthest from k-space center are acquired first. Another embodiment includes the hybrid approach applied to the angular elliptic centric acquisition during which, for instance, outer edges can be first sampled before switching to a centric acquisition.

At STEP 84 the view ordering is used to acquire MR data at STEP 84 having an optimized cost of each encoding point associated therewith. Once the MR data has been acquired, the MR data may be used to reconstruct MR images using known image reconstruction techniques.

According to an embodiment of the invention, an exemplary cost function C(r, $\theta$) is calculated as:

$$C(r, \theta) = r \times \left(1 + \alpha \frac{r}{R_{max}(\theta)} \times \frac{\theta}{2\pi}\right), \quad \text{(Eqn. 1)}$$

where $\alpha$ is a constant $\geq 0$ that is used to weight the angular contribution to the cost along with $R_{max}(\theta)$, which is the maximum directional radial distance from the origin to the edge of the acquired k-space at a given angle $\theta$. $R_{max}(\theta)$ is used to weight the contribution of $\theta$ as a function of distance. r and $\theta$ are used to define the polar coordinates of the sampled ($k_y$, $k_z$) location.

Figure 3:
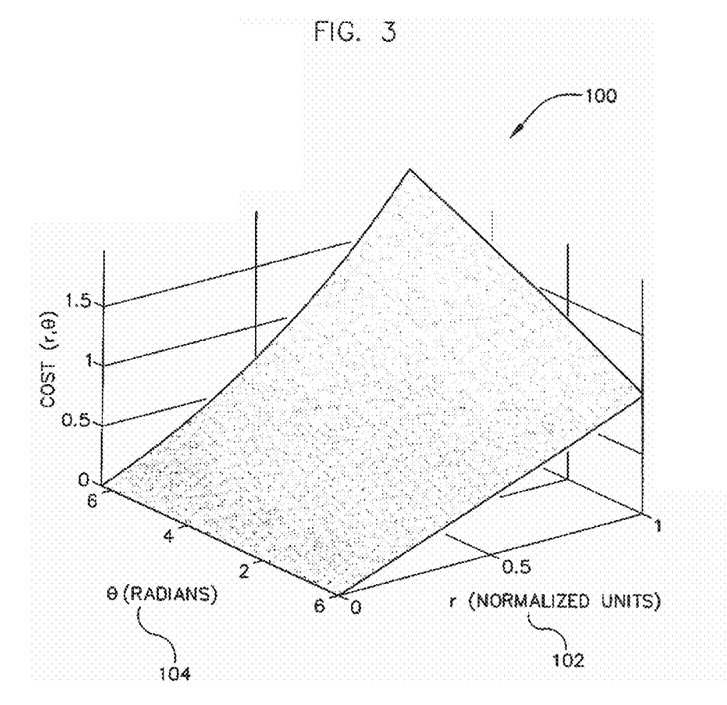
FIG. 3 illustrates a plot of an exemplary cost function C(r, θ) according to an embodiment of the invention.

Referring now to FIG. 3, the exemplary cost function C(r, $\theta$) according to this embodiment is plotted at 100 using Eqn. 1. As such, the coordinate r at 102 is normalized to vary between 0 and 1, and the coordinate $\theta$ at 104 varies between 0 and $2\pi$. Thus, the cost function C(r, $\theta$) increases monotonically with increasing distance r and angular position $\theta$. As such, MR data acquired using this cost function will collect low frequency data having optimized contrast while reducing the gradient polarity switches away from the k-space center.

Figure 4:
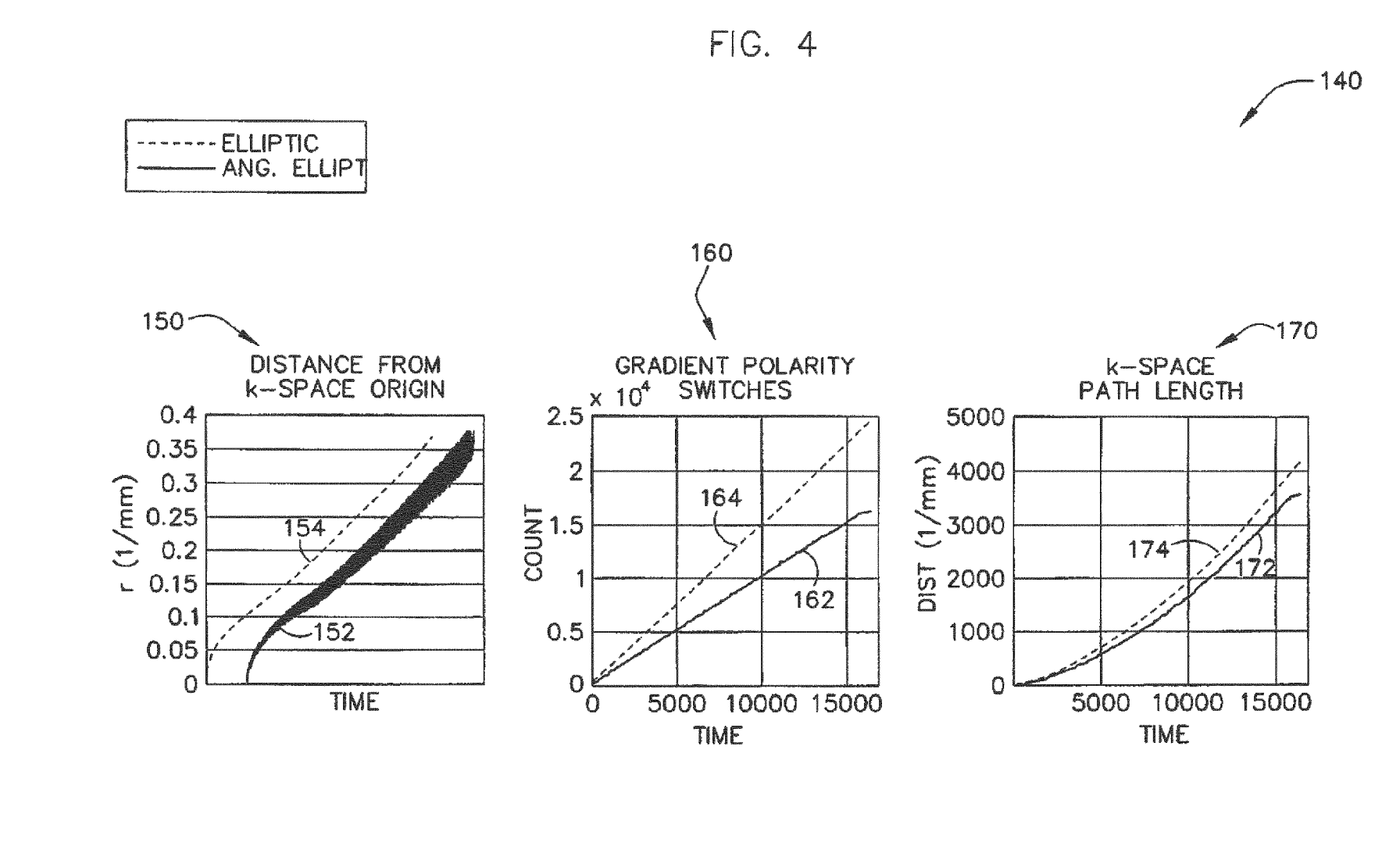
FIG. 4 illustrates, for an anisotropic acquisition, plots showing a comparison of distance from the k-space origin that includes, according to an embodiment of the invention, a reduced number of gradient polarity switches and total k-space path length for angular elliptic centric view ordering as compared to elliptic centric view ordering.
Figure 5:
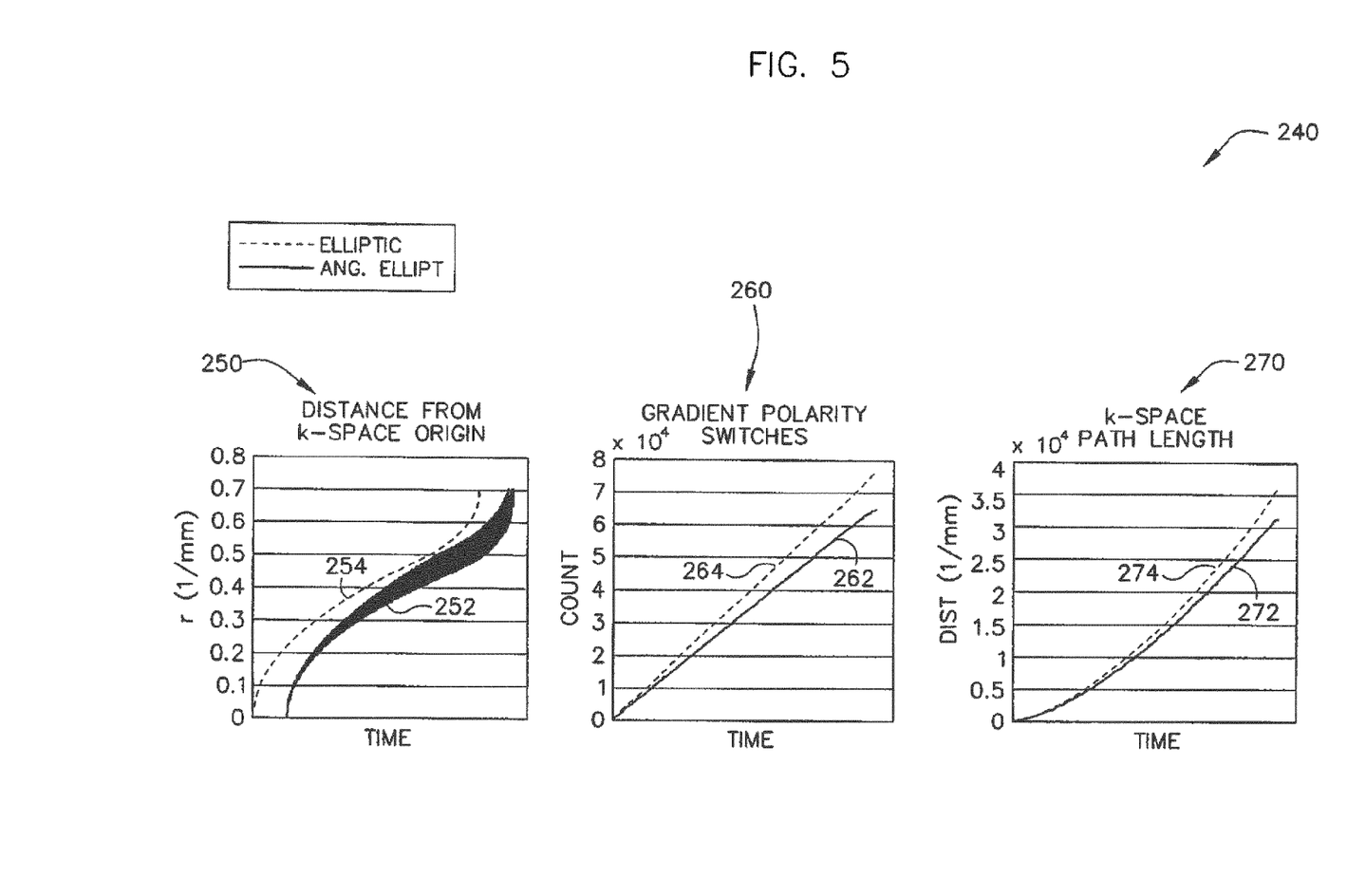
FIG. 5 illustrates, for an isotropic acquisition, plots showing a comparison of distance from the k-space origin that includes, according to an embodiment of the invention, a reduced number of gradient polarity switches and total k-space path length for angular elliptic centric view ordering as compared to elliptic centric view ordering.

FIGS. 4 and 5 illustrate k-space trajectory plots 150, 250 for a 256×256 field-of-view (FOV), and 256 slices having 1 mm thickness, for anisotropic and isotropic acquisitions 140 and 240, respectively. The distance from the k-space origin is illustrated at 150, 250 as a function of acquisition time for angular elliptic centric view ordering 152, 252 as compared to elliptic centric view ordering 154, 254. The angular elliptic plots 152, 252 are shifted in time, with respect to the elliptic centric plots 154, 254, to separate the plots for better visualization.

According to an embodiment of the invention, referring still to FIGS. 4 and 5, in both anisotropic 140 and isotropic 240 acquisitions the total number of gradient switches (illustrated at 160, 260) is reduced for angular elliptic centric view ordering. Likewise, according to the embodiment illustrated, the total k-space trajectory path length (illustrated at 170, 270), hence the acquisition time is reduced as well. In the gradient polarity switches plot 160 of anisotropic acquisition 140, the total number of gradient switches for the angular elliptic centric acquisition 162 is reduced by approximately 35% below the number of gradient switches for the elliptic centric acquisition 164. For the isotropic acquisition 240, the gradient polarity switches plot 260 shows that the total number of gradient switches for the angular elliptic centric acquisition 262 is reduced by approximately 16% below the number of gradient switches for the elliptic centric acquisition 264.

As such, k-space path length plots 170, 270 illustrate a reduced path length for each of the acquisitions 140, 240. For the anisotropic acquisition 140 and referring to k-space path length plot 170, the total path length for the angular elliptic centric acquisition 272 is reduced to approximately 85% of the total path length for the elliptic centric acquisition 174. For the isotropic acquisition 240, k-space path length plot 270 shows that the total path length for the angular elliptic centric acquisition 272 is reduced to approximately 86% of the total path length for the elliptic centric acquisition 274.

In accordance with another embodiment, an exemplary cost function $C(r, \theta)$ is calculated as:

$$c(r, \theta) = \frac{\theta}{2\pi} + \text{ceil}\left(\frac{r}{\gamma \cdot \Delta r} - \frac{\theta}{2\pi}\right) \quad \text{(Eqn. 2)}$$

where the radial distance $r = \sqrt{(y-y_{center})^2 + \gamma^2(z-z_{center})^2}$, $\gamma = y_{res}/z_{res}$, and $\theta$ is the polar angle with respect to the center of k-space. In the cost function of Eqn. 2, the distance, r, is scaled to account for different y and z axis resolutions in anisotropic acquisitions. For isotropic acquisitions, $\gamma = 1$. In an alternative embodiment, the cost function of Eqn. 2 may be modified to allow for elliptic centric view ordering in the center of k-space and angular elliptic centric view ordering (based on r and $\theta$) in the outer regions of k-space and may be given by:

$$c(r, \theta) = r \quad \text{for } r < \beta^* R\text{max}, 0 < \beta < 1; \quad \text{(Eqn. 3)}$$

and $$c(r, \theta) = \frac{\theta}{2\pi} + \text{ceil}\left(\frac{r}{\gamma \cdot \Delta r} - \frac{\theta}{2\pi}\right) \text{ for } r > \beta^* R\text{max} \quad \text{(Eqn. 4)}$$

where Rmax is the maximum k-space radial distance and $\beta$ is a constant used to determine the position of k-space) e.g., the outer radius of the central region of k-space) where elliptic centric view ordering is used and the portion of k-space where angular elliptic centric view ordering is used.

In accordance with another embodiment, an exemplary cost function is calculated as:

$$c(r, \theta) = \frac{\theta}{2\pi} + \text{ceil}\left(\frac{r}{\gamma \cdot \Delta r}\right) \quad \text{(Eqn. 5)}$$

where the radial distance $r = \sqrt{(y-y_{center})^2 + \gamma^2(z-z_{center})^2}$, $\gamma = y_{res}/z_{red}$, and $\theta$ is the polar angle with respect to the center of k-space.

Figure 6:
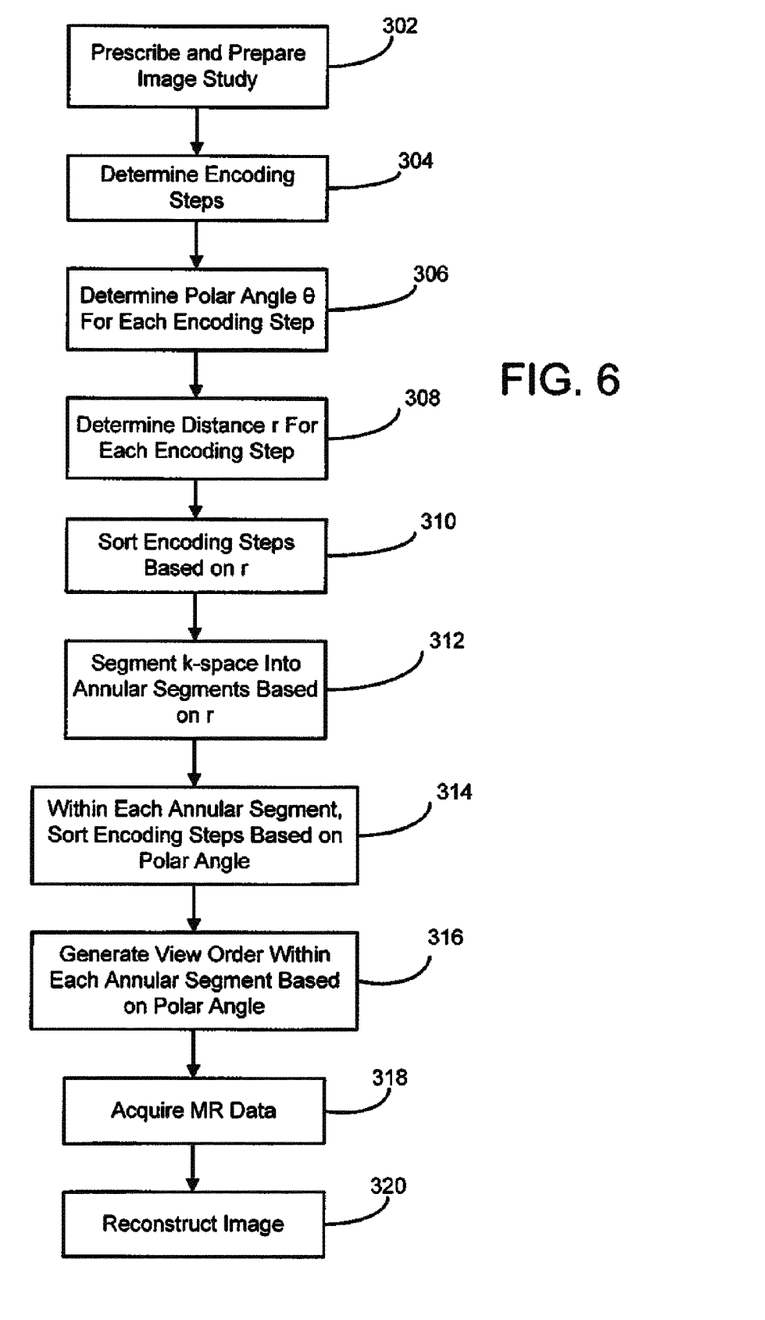
FIG. 6 shows a technique for encoding k-space locations based on both distance and polar angle in accordance with an alternative embodiment.

FIG. 6 shows a technique of encoding k-space locations based on both distance and polar angle in accordance with an alternative embodiment. The technique described below with respect to FIG. 6 provides a view ordering equivalent to the view ordering resulting from use of the cost function in Eqn. 5 above in the technique of FIG. 2. Referring to FIG. 6, at block 302, an MR imaging study is prescribed and prepared. Prescription and preparation of an MR imaging study includes user-identification of various scan parameters to define the impending scan session. Based on these parameters, the method continues at block 304 to determine the number of encoding steps for each k-space of the acquisition.

As discussed above with respect to FIG. 2, each encoding step is defined by a unique $k_y$, $k_z$ location or position in k-space. The technique calculates or otherwise determines at block 306 the polar angle, $\theta$, in radians (0-2$\pi$) or in degrees (0-360°) for each encoding step ($k_y$, $k_z$) of k-space relative to the $k_z$ axis, where $\theta = \arctan(k_y/k_z)$ or $\arctan(k_z/k_y)$. The method then determines at block 308 the distance r of each encoding step from the center of k-space. The distance r from the center of k-space for each encoding step ($k_y/k_z$) is calculated from $(k_y^2 + k_z^2)^{1/2}$, which is directional radial distance from the k-space origin.

Figure 7:
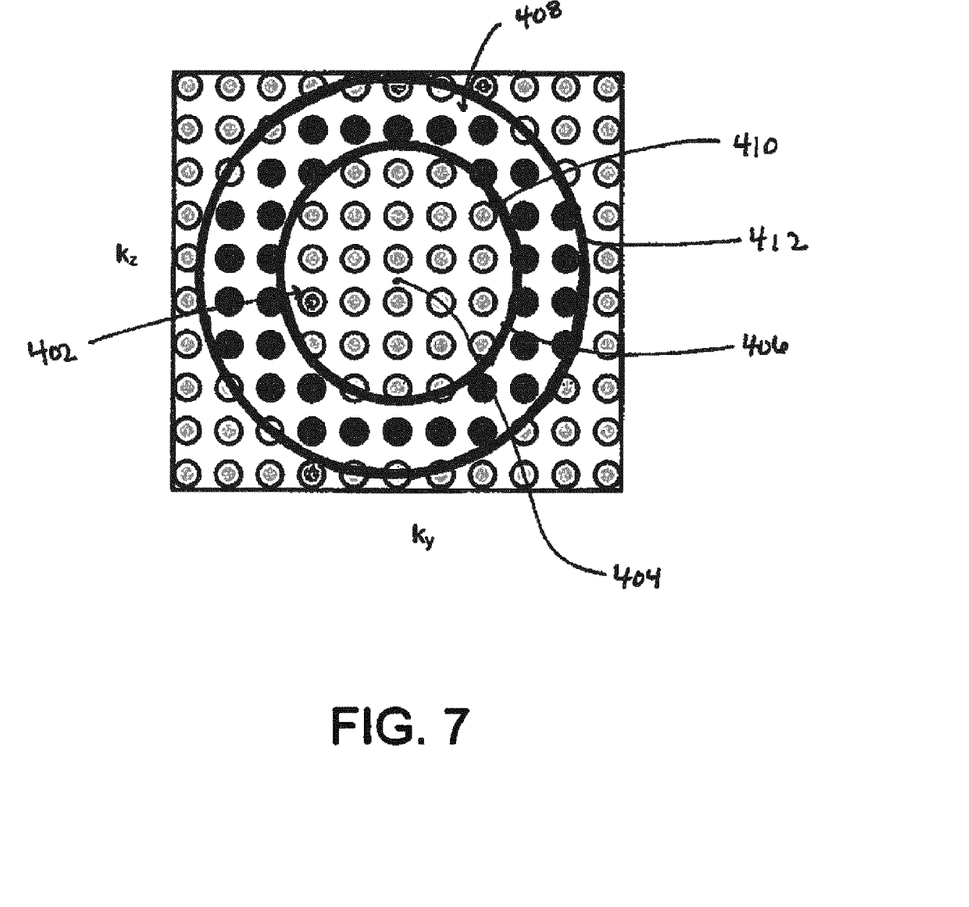
FIG. 7 illustrates an exemplary annular segment of k-space in accordance with an embodiment.

At block 310, the encoding steps of points, defined by r and $\theta$, are sorted in monotonically increasing order based on the associated distance r for each point. At block 312, k-space (e.g., a $k_y$-$k_z$ plane) is segmented (or divided) into a plurality of annular segments based on the distance r from the center of k-space. Each annular segment is formed by grouping together encoding steps or points that lie in an annular region between the distance (or radius) r and r+$\Delta$r. The annular segments start from r=0 and jump in increments of $\Delta$r which is predetermined (e.g., provided during prescription and preparation of the imaging study at block 302). FIG. 7 illustrates exemplary annular segments of k-space in accordance with an embodiment. In FIG. 7, a first annular segment 402 defines a region encompassing the center region of k-space between a first distance (or radius) $r_1$ (404), where $r_1$=0, and the distance $r_1$+$\Delta$r (406). The annular segment 402 includes encoding steps with an associated distance r from the center of k-space between $r_1$ (404) and $r_1$+$\Delta$r (406). A second annular segment 408 defines an annular region between a second distance $r_2$ (410) and the distance $r_2$+$\Delta$r (412). In one embodiment, $r_2$ may be equal to the outer radius of the previous annular segment, $r_1$+$\Delta$r (406). The annular segment 408 includes encoding steps with an associated distance r from the center of k-space between $r_2$ (410) and $r_2$+$\Delta$r (412). FIG. 7 shows an exemplary number of annular segments. Preferably, k-space is segmented in annular segments until the maximum k-space radial distance Rmax (i.e., the edge of the acquired k-space) is reached, i.e., when r+$\Delta$r of an annular segment is equal to Rmax.

At block 314, within each annular segment, the encoding steps or points are sorted based on the associated polar angle for each point. In one embodiment, the encoding steps within each annular segment are sorted in the order of increasing polar angle. In order to maintain smoothness for the acquisition, the starting polar angle in each annular segment is selected to be the closest to the ending polar angle in the previous annular segment. At block 316, a view order within each annular segment is generated based on the increasing polar angle. In one embodiment, k-space is traversed within each annular segment beginning with points having the smallest polar angle to points with the largest polar angles. The view order also traverse k-space starting with the annular segment closest to the center of k-space and moving outward to the annular segment farthest from the center of k-space. As discussed previously, the view ordering uses both distance and angular sorting to minimize the number of gradient polarity switches and the total distance (or path length) traversed in k-space. As a result, eddy current artifacts are minimized and k-space is traversed in a smooth and monotonically increasing manner.

In another embodiment, an elliptic centric view ordering may be used for the central region of k-space (e.g., the annular segment including the central region of k-space) and the annular elliptic centric view ordering described above with respect to blocks 314 and 316 may be used for the annular segments in the peripheral or outer region of k-space. In this embodiment, elliptic centric view ordering is used in the center region of k-space to maximize energy and angular elliptic centric view ordering is used in the outer region of k-space to minimize the size of the jumps between encoding steps.

At block 318, the view ordering is used to acquire MR data of each encoding point. Once the MR data has been acquired, the MR data may be used to reconstruct MR images at block 320 using known image reconstruction techniques.

As described herein, embodiments of the invention provide an angular elliptic centric view ordering for k-space sampling that is robust, efficient, and less sensitive to eddy current induced artifacts, while collecting low frequency data having high contrast. The phase encoding order described herein thus reduces eddy current induced artifacts relative to conventional elliptic centric phase encoding. Embodiments of the invention are applicable to elliptic centric view ordering and contrast-enhanced dynamic applications such as Time-Resolved Imaging of Contrast Kinetics (TRICKS) and MR angiography. Embodiments of the invention present a generic view ordering scheme that can be applied to any non-segmented steady state imaging, as well as transient state imaging by interleaved view ordering of angular elliptic sorted data. The MR data close to the center of k-space may be used for general motion monitoring and/or correction as well as for contrast studies. Embodiments of the invention are also applicable with physiologically gated and non-gated acquisitions, dedicated and non-dedicated magnetization preparation sequences, and imaging techniques with or without dedicated recovery periods.

A technical contribution for the disclosed method and apparatus is that it provides for a computer implemented system and method of optimizing 3D MR acquisitions by using an angular elliptic centric view ordering scheme.

In accordance with one embodiment of the invention, a method of magnetic resonance (MR) imaging includes segmenting a $k_y$-$k_z$ plane comprising a plurality of encoding points into a plurality of annular segments; for each annular segment, defining a view ordering based on a polar angle associated with each encoding point contained within the annular segment; acquiring MR data for the plurality of encoding points based on the view ordering for each annular segment; and generating at least one MR image using the acquired MR data.

In accordance with another embodiment of the invention, a computer readable storage medium having a computer program stored thereon and representing a set of instructions that, when executed by a computer, causes the computer to segment a $k_y$-$k_z$ plane comprising a plurality of encoding points into a plurality of annular segments, for each annular segment, define a view ordering based on a polar angle associated with each encoding point contained within the annular segment, acquire MR data for the plurality of encoding points based on the view ordering for each annular segment and generate at least one MR image using the acquired MR data.

In accordance with yet another embodiment of the invention, a method of magnetic resonance (MR) imaging includes calculating a cost for each encoding point in a plurality of encoding points to be acquired in k-space based on a polar angle and a radial distance from a center of k-space, the radial distance scaled based on a resolution of an acquisition, acquiring MR data for each encoding point based on the cost, and reconstructing an MR image using the acquired MR data.

The invention has been described in terms of the preferred embodiment, and it is recognized that equivalents, alternatives, and modifications, aside from those expressly stated, are possible and within the scope of the appending claims.

We claim:

1. A method of magnetic resonance (MR) imaging comprising:
    segmenting a $k_y$-$k_z$ plane comprising a plurality of encoding points into a plurality of annular segments;
    for each annular segment, defining a view ordering based on a polar angle associated with each encoding point contained within the annular segment;
    acquiring MR data for the plurality of encoding points based on the view ordering for each annular segment; and
    generating at least one MR image using the acquired MR data.

2. A method according to claim 1, further comprising for each annular segment, sorting the encoding points in order of increasing polar angle.

3. A method according to claim 1, wherein acquiring MR data comprises acquiring MR data for encoding points in order of increasing polar angle.

4. A method according to claim 1, wherein the plurality of annular segments comprises an inner annular segment comprising encoding points in a central region of k-space and a plurality of outer annular segments comprising encoding points outside of the central region of k-space.

5. A method according to claim 4, wherein the encoding points of the inner annular segment are acquired using an elliptic centric view ordering and the encoding points of the plurality of outer annular segments are acquired in order of increasing polar angle.

6. A non-transitory computer readable storage medium having a computer program stored thereon and representing a set of instructions that, when executed by a computer, causes the computer to:
    segment a $k_y$-$k_z$ plane comprising a plurality of encoding points into a plurality of annular segments;
    for each annular segment, define a view ordering based on a polar angle associated with each encoding point contained within the annular segment;
    acquire MR data for the plurality of encoding points based on the view ordering for each annular segment; and
    generate at least one MR image using the acquired MR data.

7. A non-transitory computer readable storage medium according to claim 6, further comprising for each annular segment, sorting the encoding points in order of increasing polar angle.

8. A non-transitory computer readable storage medium according to claim 6, wherein acquiring MR data comprises acquiring MR data for encoding points in order of increasing polar angle.

9. A non-transitory computer readable storage medium according to claim 6, wherein the plurality of annular segments comprises an inner annular segment comprising encoding points in a central region of k-space and a plurality of outer annular segments comprising encoding points outside of the central region of k-space.

10. A non-transitory computer readable medium according to claim 9, wherein the encoding points of the inner annular segment are acquired using an elliptic centric view ordering and the encoding points of the plurality of outer annular segments are acquired in order of increasing polar angle.

11. A method of magnetic resonance (MR) imaging comprising:
    calculating a cost for each encoding point in a plurality of encoding points to be acquired in k-space based on a polar angle and a radial distance from a center of k-space, the radial distance scaled based on a resolution of an acquisition;
    acquiring MR data for each encoding point based on the cost; and
    reconstructing an MR image using the acquired MR data.

12. A method according to claim 11, further comprising sorting the plurality of encoding points monotonically from a low cost to a high cost using the cost calculated for each encoding point.

13. A method according to claim 11, wherein acquiring MR data comprises acquiring at least a first portion of MR data having progressively increasing cost.

14. A method according to claim 13, wherein the first portion of MR data is acquired beginning at a center of k-space.

15. A method according to claim 11, wherein the acquisition is an anisotropic acquisition.

16. A method according to claim 11, wherein the cost function is given as:

$$c(r, \theta) = \frac{\theta}{2\pi} + \text{ceil}\left(\frac{r}{\gamma \cdot \Delta r} - \frac{\theta}{2\pi}\right),$$

wherein the radial distance is given as $r = \sqrt{(y-y_{center})^2 + \gamma^2(z-z_{center})^2}$ and $\theta$ is a polar angle of k-space.

17. A method according to claim 11, wherein the cost function is given as $$c(r, \theta) = \frac{\theta}{2\pi} + \text{ceil}\left(\frac{r}{\gamma \cdot \Delta r}\right),$$

wherein the radial distance is given as $r = \sqrt{(y-y_{center})^2 + \gamma^2(z-z_{center})^2}$ and $\theta$ is a polar angle of k-space.

* * * * *